July 1, 1969 W. E. SHOEMAKER 3,453,554
HIGH PERFORMANCE CIRCUIT INSTRUMENTATION AMPLIFIER WITH HIGH COMMON MODE REJECTION
Filed Aug. 5, 1968
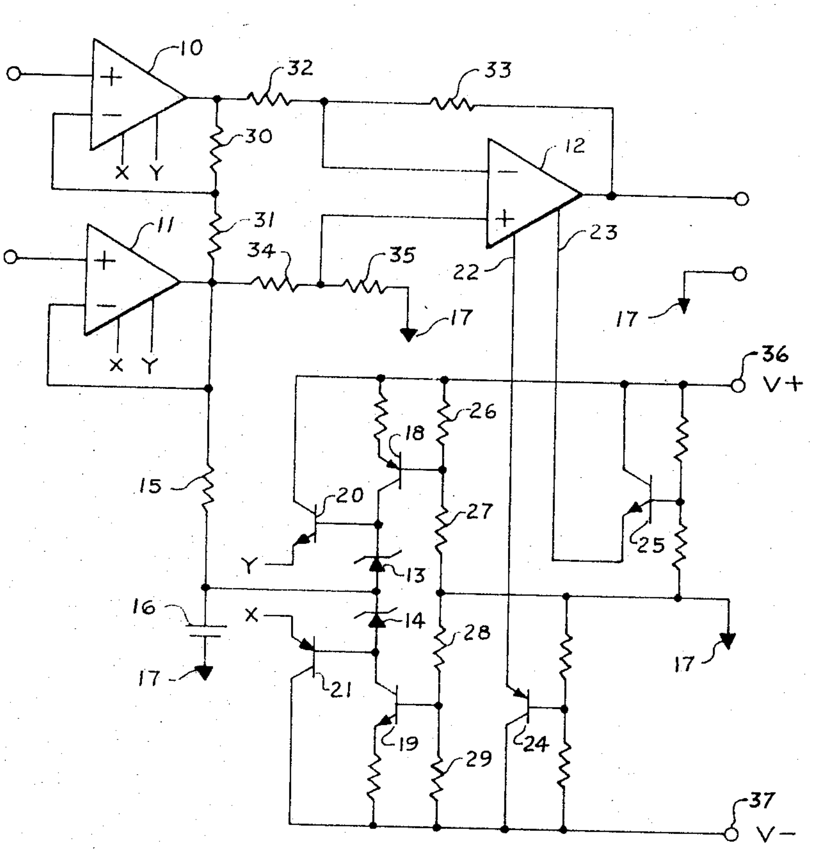
INVENTOR.
WILLIAM E. SHOEMAKER
BY TE Kristofferson
ATTORNEY 3,453,554

HIGH PERFORMANCE CIRCUIT INSTRUMENTATION AMPLIFIER WITH HIGH COMMON MODE REJECTION

William E. Shoemaker, Fullerton, Calif., assignor to Beckman Instruments, Inc., a corporation of California Filed Aug. 5, 1968, Ser. No. 750,439
Int. Cl. H03f 3/68
U.S. Cl. 330—30 4 Claims

ABSTRACT OF THE DISCLOSURE

A high performance instrumentation integrated circuit amplifier employing three integrated circuit amplifiers, two connected in the input and the third differentially connected in the output with one of the two input amplifiers employing unity gain for amplifying common mode and referencing the other two amplifiers. The power supply terminals for the input amplifiers may also be driven with the common mode output of the unity gain amplifier.

*Background of the invention*

This invention relates to a high performance integrated circuit instrumentation amplifier and more particularly to such an amplifier employing an input stage having unity gain for referencing other stages for the elimination of common mode and a driven power supply driven from the common mode for driving the input stages.

In the prior art, common mode rejection has been achieved by feeding back signals generally to the emitter circuit of the input stage of an amplifier. Examples of different ways for accomplishing this can be found in U.S. Patents 3,046,487, Matzen et al.; 3,189,840, Braymer et al.; and 3,275,945, Walker et al. as well as in a copending application entitled "Direct Coupled Differential Transistor Amplifier with Improved Common Mode Performance," Ser. No. 496,878, Weekes et al. filed Oct. 18, 1965 and assigned to the assignee of the present application.

All the techniques disclosed in the foregoing require that the emitter circuit be accessible at various points for feeding back the signal. With the introduction of integrated circuits which do not necessarily have this accessibility, the techniques employed in the above references have not been feasible. Individual integrated circuit amplifiers with optimized performance can be designed to have a common mode rejection of 80 db. However, for high performance instrumentation amplifiers, 120 db is often desirable.

*Summary of the invention*

Accordingly, it is an object of this invention to provide a high performance integrated circuit instrumentation amplifier provided with high common mode rejection.

Another object of the invention is to provide such an amplifier with a driven reference power supply.

These and other objects are achieved by providing a high performance instrumentation amplifier employing three integrated circuit operational amplifiers each with noninverting and inverting input terminals, a pair of power supply terminals and an output terminal. The input signal is connected across the noninverting input terminals of the first and second amplifiers and a resistive divider is connected between the output terminals with its junction connected to the inverting input terminal of the first amplifier. A direct connection is made from the output terminal of the second amplifier to its inverting input terminal to provide it with unity gain. A second resistive divider is connected from the output terminal of the first amplifier to the output terminal of the third amplifier with its junction connected to the inverting input terminal of the third amplifier. A third resistive divider is connected from the output of the second amplifier to a common terminal with its junction connected to the noninverting input terminal of the third amplifier. The output of the second amplifier approaches the common mode voltage for low level signals and references the first and third amplifiers in order to improve common mode rejection.

In an alternative embodiment, means are provided for driving the voltage levels of an associated power supply from the output terminal of the second amplifier to vary with the common mode voltage in order to drive the power supply terminals of the first and second amplifiers to improve common mode rejection.

The novel features which are believed to be characteristic of the invention are set forth with particularity in the appended claims. The invention and further objects and advantages thereof can best be understood by reference to the following description and accompanying drawing.

*Brief description of the drawing*

The drawing is a schematic diagram of an instrumentation amplifier in accordance with the invention, including the driven reference power supply.

*Description of the preferred embodiment*

The figure shows how three operational amplifiers, such as integrated circuit amplifiers μA709c which are available from Fairchild, Motorola, Texas Instruments or any other of a number of suppliers of such circuits, can be uniquely combined to form a high performance instrumentation amplifier. Before describing the figure in detail, common mode and differential mode voltages will be briefly discussed. Further information with regard to this can be found in the above referenced patents and in particular in the above referenced copending application.

Common mode voltage is the instantaneous average voltage at a pair of terminals. If the voltage at one terminal is $V_a$ and this voltage at the other is $V_b$, then the common mode voltage $V_c$ is the sum of these divided by two. Differential mode voltage will be defined as a difference voltage at the two input terminals or $V_b-V_a$. It is sometimes felt that the true differential mode voltage is one-half of the difference voltage. However, the above will be used herein and it may be helpful to assume that DM means difference mode instead of differential mode and $V_d$ means difference mode voltage. Common mode rejection of an amplifier can be defined as the ratio of the common mode input voltage $V_c$ to a difference mode input voltage $V_d$ which would produce the same amplifier output and is therefore the ratio of the difference mode gain $G_d$ to common mode gain $G_c$. The common mode rejection of an amplifier is easily measured by connecting the two inputs together, driving them with a voltage with respect to ground of $V_c$ and observing the amplifier output voltage $V_o$. The equation $$CMR=G_d\cdot\frac{V_c}{V_o} \qquad (1)$$

is then used to compute common mode rejection.

In an ideal differential input amplifier the common mode gain is zero, giving an infinitely large common mode rejection. In many amplifiers the major contribution to common mode gain is a slight imbalance between the pair of differential mode input stages, resulting in the conversion of common mode voltages to differential mode signal. It is quite difficult to reduce this imbalance to the extent that the common mode rejection exceeds $10^4$ or 80 db.

Other common mode characteristics of interest are the common mode input impedances $Z_{ai}$ and $Z_{bi}$ which are infinitely in an ideal amplifier. These two impedances are often quite symmetrical or equal but are nevertheless detrimental when there are unequal resistances in the two input lines driving the amplifier. The result is conversion of common mode voltage to differential mode voltage in the input lines. The ratio of the common mode voltage to the resulting differential mode voltage can be called common mode rejection of the input circuit or $CMR_i$. For the values of source resistance and the common mode input impedances normally encountered, the value of $CMR_i$ is very nearly $$CMR_i=\frac{1}{\frac{R_b}{Z_{bi}}-\frac{R_a}{Z_{ai}}} \qquad (2)$$

where $R_a$ equals the resistance in input line *a* and $R_b$ equals the resistance in input line *b*. The total common mode rejection is a combination of the amplifier common mode rejection and the input common mode rejection. If $CMR_i$ is to be 1,000,000 or more and if $R_a-R_b$ is 1,000 ohms, for example, then $Z_{ai}$ and $Z_{bi}$ must both exceed $10^9$ ohms.

The instrumentation amplifier illustrated in the drawing has an exceptionally large value of common mode rejection, $Z_{ai}$ and $Z_{bi}$, even when the three operational amplifiers 10, 11 and 12 themselves have relatively small values of common mode rejection and common mode input impedances. Driving the power supply inputs of amplifiers 10 and 11 in accordance with the output of amplifier 11, as will be described hereinafter, substantially contributes to the improved performance.

Referring to the drawing, the output of amplifier 11 drives the junction of the Zener diodes 13 and 14 through the RC coupling or filter circuit of resistor 15 and capacitor 16 which are connected in series from the output terminal of amplifier 11 to the common terminal 17. The current through Zener diode 13 does not change significantly because it is supplied by the current source transistor 18. The current-through Zener diode 14 similarly does not change significantly because it is determined by the current sink transistor 19. The base of transistor 20 is therefore above the output of amplifier 11 by the constant voltage drop across the Zener diode 13 and the base of transistor 21 is more negative than the output of amplifier 11 by the constant voltage drop across the Zener diode 14. Transistors 20 and 21 are emitter-folowers for driving the plus and minus voltage points of amplifiers 10 and 11 labeled *x* and *y* respectively and referred to as the amplifier power supply terminals. The voltages at the power supply terminals of amplifiers 10 and 11 are therefore essentially constant values plus the output voltage of amplifier 11.

The high frequency roll-off of the circuit including resistor 15 and capacitor 16 might be required to prevent very high frequency, or several mHz., oscillations but has virtually no effect on the D.C. and lower frequency performance. The power supply terminals 22 and 23 of amplifier 12 are driven through the transistors 24 and 25, respectively, which are not driven by the common mode as it is not necessary to drive the final stage of the instrumentation amplifier in this manner since the amount of gain contributed by it compared to a signal going all the way through the entire amplifier is not significant. The bases of transistors 18 and 19 are referenced across the power supply terminals 36 and 37 which provide a source of potential by connecting the potential divider comprising series resistors 26, 27, 28 and 29 across terminals 36 and 37. The junction of resistors 27 and 28 is connected to common terminal 17 and the junctions of resistors 26 and 27 and 28, 29 are connected to the bases of transistors 18 and 19, respectively. Transistors 24 and 25 are similarly referenced but as previously mentioned are not driven by the common mode of output of the amplifier 11.

Returning to the instrumentation amplifier proper it can be seen that a potential divider comprising resistors 30 and 31 is connected from the output terminal of amplifier 10 to the output terminal of amplifier 11. The junction of the resistors 30 and 31 is connected back to he inverting input terminal of the amplifier 10 designated by the minus sign. The output terminal of amplifier 11, however, is directly connected back to the inverting input terminal of amplifier 11 providing it with unity gain. This unity gain in the bottom leg including amplifier 11 permits amplifier 11 to operate at the common mode for low level signals which is used to establish a reference for the other amplifiers. A potential divider comprising the resistors 32 and 33 is connected from the output terminal of amplifier 10 to the output terminal of amplifier 12. The center tap or junction of 32 and 33 is connected to the inverting input terminal of amplifier 12. An additional divider comprising resistors 34 and 35 is connected from the output terminal of amplifier 11 to the common terminal 17, the junction of resistors 34 and 35 being connected to the noninverting input terminal of amplifier 12.

The circuit described above provides correction for improved common mode rejection even though the emitter circuits of the integrated circuit amplifiers 10, 11 and 12 are not available for connection in the manner disclosed in the above cited references. This circuit makes correction feasible in integrated circuit operational amplifiers. It is also possible to use two or more amplifiers in place of amplifier 10 in order to obtain higher gain for improved accuracy and/or to facilitate gain changing.

In summary, the high performance instrumentation amplifier circuit can be used with or without driving the power supply for amplifiers 10 and 11. Driving this power supply gives better common mode rejection performance. Typical values for the resistances employed are as follows:

| | Ohms |
|---|---|
| Resistor **30** | 99,000 |
| Resistor **31** | 1,000 |
| Resistors **32** and **34** | 5,000 |
| Resistors **33** and **35** | 50,000 |

Other important characteristics are the input quiescent current and offset voltage and their variation with time and temperature. These characteristics are essentially the characteristics of the amplifiers 10 and 11. Additional circuits may be added to compensate for these effects by providing them with adjustments or resistor trim locations to permit reducing the quiescent values to zero at a particular time and temperature. The input current into the noninverting inputs of amplifiers 10 and 11 can be compensated from current sources which have the same temperature coefficient which the input currents typically have. The input current to the inverting input of amplifier 10 can also be likewise compensated to minimize errors related to input current existing in resistor 31.

The effect of the coupling network including resistor 15 and capacitor 16 is that beyond the corner of the filter which is typically 1.6 mHz. the common mode rejection is essentially the same as the common mode rejection when the power supply lines of amplifiers 10 and 11 are not driven. At mid-frequencies (100 hertz to 10 kilohertz) the CMR is given by the following equation:

$$CMR=\frac{1}{-\frac{1}{G_{d_{11}}}\left(\frac{R_{o_{11}}}{R_{34}+R_{35}}\right)+\frac{1}{G_{d_{12}}}\left(\frac{R_{o_{10}}}{R_{32}+R_{33}}\right)+\frac{1}{CMR_{12}}\left(\frac{1}{\frac{R_{30}}{R_{31}}+1}\right)} \qquad (3)$$

with the first term in the denominator predominating beyond 500 hertz and where $G_{d11}$=differential mode gain of amplifier 11
$G_{d12}$=differential mode gain of amplifier 12
$CMR_{12}$=common mode rejection of amplifier 12
$R_{o10}$=output resistance of amplifier 10
$R_{o11}$=output resistance of amplifier 11
$R_{30}$, $R_{31}$, $R_{32}$, $R_{33}$, $R_{34}$, $R_{35}$=resistance of these respective resistors.

Another advantage of the instrumentation amplifier is the common mode capability at low gain. Amplifiers used in the 10, 11 and 12 locations typically have common mode capability of +8 volts. If, for example, +20 volts of common mode capability is desired, it is only necessary to make the potentials on the terminals 24 and 25 approximately $$V+\geq|V_{vr13}|+22 \text{ v.} \qquad (4)$$
$$V-\leq|V_{vr14}|-22 \text{ v.} \qquad (5)$$

where $V_{vr13}$ and $V_{vr14}$ are the voltage drops across Zener diodes 13 and 14 respectively and to make the value of resistor 33 divided by resistor 32 less than or equal to .4. The only critical requirement is that amplifier 10 be able to supply an output voltage of $(R_{32}/R_{33})\cdot V_o$, where $V_o$ is the output of amplifier 12 or the over-all output of the instrumentation amplifier, or ±12.5 volts if $R_{33}/R_{32}$ equals .4 and if $V_o$ equals ±5 volts. This ±12.5 volt output capability is close to typical for the type of amplifiers used in the 10, 11 and 12 locations.

Since the principles of the invention have now been made clear, modifications which are particularly adapted for specific situations without departing from those principles will be apparent to those skilled in the art.

What is claimed is:

1. A high performance instrumentation amplifier including:
- first, second and third integrated circuit operational amplifiers each having a noninverting and an inverting input terminal, a pair of power supply terminals and an output terminal;
- a common terminal;
- means for connecting a low level signal to be measured between the noninverting input terminals of said first and second amplifiers;
- a resistive divider comprising at least first and second series connected resistors connected between the output terminals of said first and second amplifiers with the junction of said first and second resistors connected to the inverting input terminal of said first amplifier;
- a direct connection from the output terminal to the inverting input terminal of said second amplifier to provide it with unity gain;
- a second resistive divider comprising at least third and fourth series connected resistors connected from the output terminal of said first amplifier to the output terminal of said third amplifier with the junction of said third and fourth resistors connected to the inverting input terminal of said third amplifier;
- a third resistive divider comprising at least fifth and sixth series connected resistors connected from the output of said second amplifier to said common terminal with the junction of said fifth and sixth resistors connected to the noninverting input terminal of said third amplifier, whereby the output of said second amplifier approaches the common mode voltage for low level signals and references said first and third amplifiers in order to improve the common mode rejection of the instrumentation amplifier.

2. The instrumentation amplifier of claim 1 including a power supply for energizing the power supply terminals of said first, second and third amplifiers:
- means for driving the voltage levels for energizing at least the power supply terminals of said first and second amplifiers from the output terminal of said second amplifier to vary with the common mode voltage in order to improve the common mode rejection of the instrumentation amplifier.

3. The instrumentation amplifier of claim 2 in which said power supply includes first and second opposite conductivity type transistors each having its collector-emitter circuit connected from a different end of two series connected Zener diodes to a different one of two terminals of a source of potential above and below common, and each having its base referenced from a point between common and its source terminal on a potential divider connected across said source terminals and having a tap connected to common;
- third and fourth opposite conductivity type transistors each having its collector connected to one of said source terminal and its base connected to the junction of said first or second transistor and the one of said Zener diodes adjacent its collector's source terminal;
- an R-C coupling circuit comprising a seventh resistor connected from the output terminal of said second amplifier through a capacitor to common with the junction of said seventh resistor and capacitor connected to the junction of said Zener diodes; and,
- means connecting each of the emitters of said third and fourth transistors in emitter follower configuration to a different one of the power supply terminals of each of said first and second amplifiers.

4. The amplifier of claim 1 in which said first amplifier comprises a plurality of amplifiers in series.

References Cited

UNITED STATES PATENTS 3,304,507 2/1967 Weeks et al. -------- 330—69 X

ROY LAKE, *Primary Examiner.*

LAWRENCE J. DAHL, *Assistant Examiner.*

U.S. Cl. X.R.

330—38, 69